United States Patent
Balzer et al.

(10) Patent No.: US 6,196,878 B1
(45) Date of Patent: Mar. 6, 2001

(54) ARRANGEMENT FOR CODED AND UNCODED PLUG-IN MODULES AND DEVICE FOR CONNECTING EXTERNAL LINES USING THE ARRANGEMENT

(75) Inventors: Kurt Balzer, Hagenbach; Siegfried Morlock, Remchingen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/308,766

(22) PCT Filed: Nov. 20, 1997

(86) PCT No.: PCT/DE97/02726

§ 371 Date: Jul. 23, 1999

§ 102(e) Date: Jul. 23, 1999

(87) PCT Pub. No.: WO98/24282

PCT Pub. Date: Jun. 4, 1998

(30) Foreign Application Priority Data

Nov. 22, 1996 (DE) .......................................... 296 20 407 U

(51) Int. Cl.[7] .................................................. H01R 13/625
(52) U.S. Cl. ............................................................. 439/674
(58) Field of Search ..................................... 439/677, 680, 439/681; 361/728, 729, 730

(56) References Cited

U.S. PATENT DOCUMENTS

| | | | |
|---|---|---|---|
| 3,668,605 | * 6/1972 | Albert | 339/18 B |
| 4,283,796 | * 8/1981 | Hughes | 455/349 |
| 4,401,358 | 8/1983 | Daigaku . | |
| 4,738,632 | * 4/1988 | Schmidt et al. | 439/341 |
| 4,772,227 | * 9/1988 | Pelzl et al. | 439/681 |
| 4,790,763 | * 12/1988 | Weber et al. | 439/65 |
| 4,926,149 | * 5/1990 | Saens et al. | 335/132 |
| 5,253,140 | * 10/1993 | Inoue et al. | 361/728 |
| 5,716,241 | * 2/1998 | Hennemann et al. | 439/716 |
| 5,737,194 | * 4/1998 | Hopkins et al. | 361/800 |

FOREIGN PATENT DOCUMENTS

| | | |
|---|---|---|
| 607 542 | 12/1978 | (CH) . |
| 25 11 135 | 9/1976 | (DE) . |
| 271 606 | 9/1989 | (DE) . |
| 43 23 440 | 2/1995 | (DE) . |
| 0 113 795 | 7/1984 | (EP) . |
| 0 392 629 | 10/1990 | (EP) . |

* cited by examiner

Primary Examiner—Brian Sircus
Assistant Examiner—Thanh-Tam Le
(74) Attorney, Agent, or Firm—Kenyon & Kenyon

(57) ABSTRACT

A device for encoding plug-in modules reliably prevents a plug-in module with a 24 V direct voltage supply from being inserted directly to the right of a plug-in module with a 230 V alternating voltage supply in a device for connecting external lines fitted with equidistant, adjacent receptacles for plug-in modules. However, this is possible on the left side, and plug-in modules of the same type can be inserted next to each other in any combination.

3 Claims, 2 Drawing Sheets

ARRANGEMENT FOR CODED AND UNCODED PLUG-IN MODULES AND DEVICE FOR CONNECTING EXTERNAL LINES USING THE ARRANGEMENT

FIELD OF THE INVENTION

The present invention relates to an arrangement for coded and uncoded plug-in modules as well as a device for connecting external lines using an arrangement of this type.

BACKGROUND INFORMATION

A device for connecting external lines to a programmable controller, which can be linked to the latter for transmitting signals and can be installed at any distance from the programmable controller, is described in German Patent Application No. 43 23 440 A1. The connecting device makes it possible to have a modular layout in which each actuator or sensor connection can be provided with one terminal, which, depending on the type of connection, can be provided with an electronic module for signal matching and conversion. Input and output modules can be mixed in any combination. This has an advantageous effect on project planning, installation, troubleshooting, and upgrading of the electronic device. The connecting device simultaneously functions as a support unit for the electronic modules, which are designed in the form of plug-in modules, and has a plurality of equidistant, adjacent receptacles of the same type for those modules. Supply and signal lines are routed to the electronic modules via a connector attached to the receptacle. Each electronic module contains a signal matching circuit for the signals of a signal channel supplied on the external lines. Connecting elements for connecting external lines are attached with the same spacing as the receptacles and are assigned to the latter.

SUMMARY

An object of the present invention is to provide an arrangement for coded and uncoded plug-in modules which makes it possible, in the case of two types of plug-in modules that can be connected next to any plug-in module of the same type in equidistant, adjacent receptacles, to prevent a plug-in module of one type from being inserted into a directly adjacent receptacle on one side of a plug-in module of the other type. A second object is to provide a device for connecting external lines, achieving a higher packing density while simultaneously meeting the minimum creepage distance requirements.

The present invention has the advantage that it doubles the packing density when using electronic modules with low operating voltages. At the same time, electronic modules with a low operating voltage can be mixed with electronic modules having a higher operating voltage in the same support unit without exceeding the required minimum creepage distances in each case. For this purpose, the new plug-in module establishes a specific, mandatory mounting sequence which cannot be altered by the user. This makes the arrangement considerably more fail-safe.

DETAILED DESCRIPTION

Figure 1:
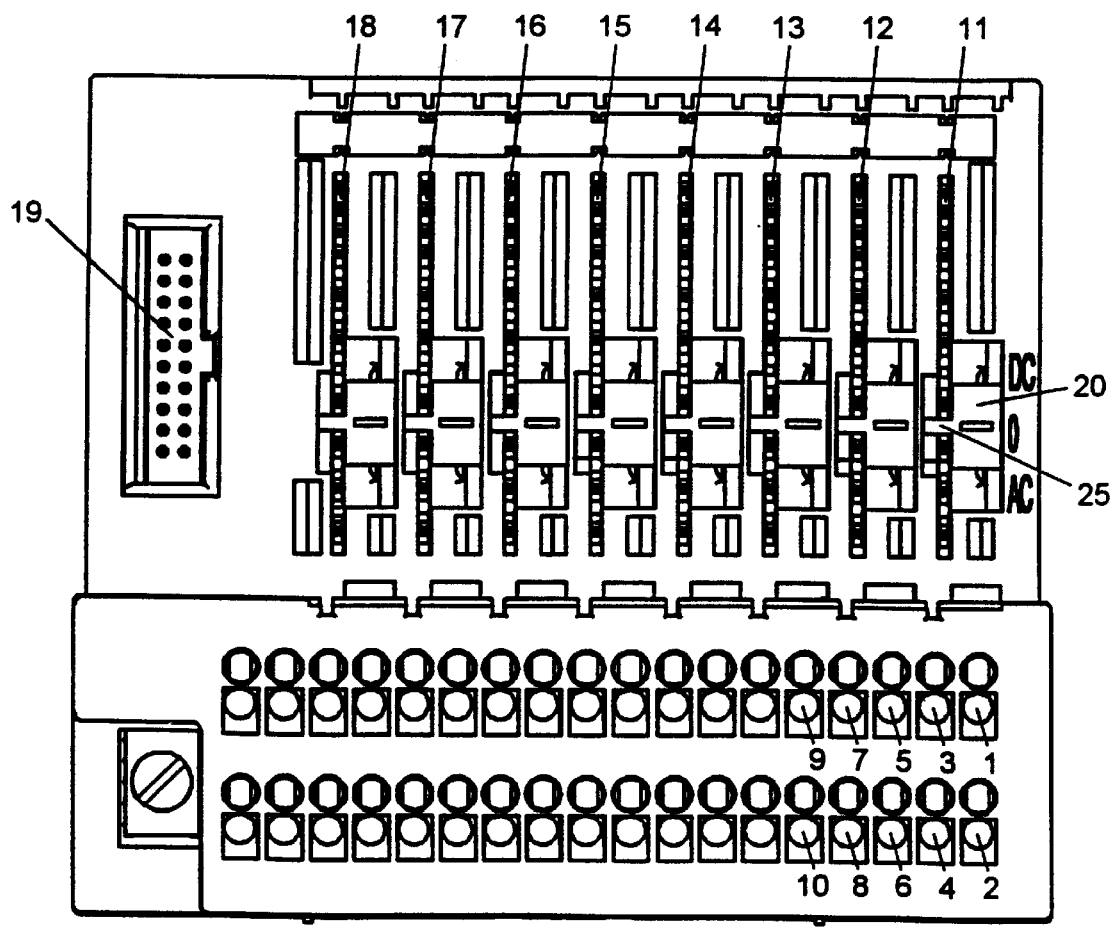
FIG. 1 shows a support unit of a device for connecting external lines.

The support unit illustrated in FIG. 1 is a device for connecting external lines to a programmable controller. The external lines, which lead, for example, to sensors or actuators in a process to be controlled, are connected in the lower portion of the electronic device, e.g., to connecting elements 1 to 10, which are designed in the form of terminals with actuating openings located above them. In the upper portion of the device are arranged receptacles 11 to 18 for electronic modules that contain a signal matching circuit and perform a signal preprocessing operation, which can vary according to the type of external line. Data is transmitted to the programmable controller exclusively via a digital interface 19, with a digital signal being provided in each of its channels. Two vertically arranged terminals are needed for one signal channel. One electronic module with a 24 V direct voltage supply can control two signal channels. For example, if a 24 V module is inserted into receptacle 11, a slide switch 20 is placed in position "DC", and external lines for 24 V sensors or actuators can be connected to a first signal channel via terminals 1 and 2 as well as to a second signal channel via terminals 3 and 4. In the case of electronic modules with a 230 V alternating voltage supply, only one signal channel is controlled, which, in this case, is routed to the terminal pair on the right. For receptacle 11, these are terminals 1 and 2. If a 230 V module is inserted, slide switch 20 must be placed in position "AC". For lines that are connected to a 230 V module, the minimum creepage distance must be greater than 5.5 mm. To meet this requirement, it is necessary to ensure that the terminals adjacent to the terminals of the signal channel of an AC module remain unassigned. For example, if a 230 V module is inserted into receptacle 12, terminals 5 and 6 are used for wiring its signal channel. Terminals 7 and 8 automatically remain unassigned, since they are provided for the module in receptacle 12, which does not have a second signal channel in this configuration. However, it is important that terminals 3 and 4 also remain free. This means that a 24 V module designed for two signal channels should not be inserted immediately to the right of a 230 V module, although a one-channel 230 V module can be inserted here. This is prevented by the coding on the housing of the electronic modules, which are also referred to as plug-in modules. Any module can then be inserted into receptacle 13, since terminals 7 and 8 are, after all, not assigned.

Figure 2:
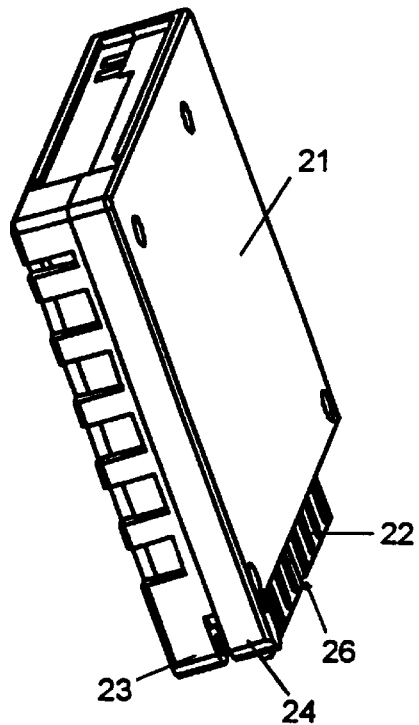
FIG. 2 shows a perspective view of an uncoded plug-in module.
Figure 3:
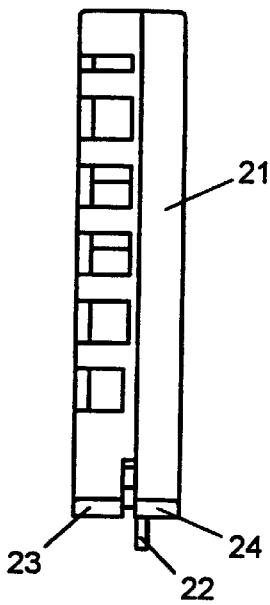
FIG. 3 shows a side view of the uncoded plug-in module illustrated in FIG. 2.

FIG. 2 shows a perspective view and FIG. 3 a side view of an uncoded plug-in module. The same reference numbers are used for the same components. Housing 21 extends across more or less the entire width of a receptacle array, which measures 10:16 mm. Housing 21 contains a printed board assembly 22, which projects laterally over housing 21 on the side where it is inserted into slots in the support unit. For insertion into the support unit illustrated in FIG. 1, the modules are suspended from the upper edge of the support unit by pivot pins 23 and 24 and swiveled downward so that the side edges of p.c. board 22 form a plug connection with contact springs in the slots via the contact surface located on the upper side of the board. In order for an electronic module designed for a direct voltage supply to be inserted into only one receptacle wired for this purpose, the side edge is provided with a recess 26 which corresponds to the position of pin 25 (FIG. 1) when coding switch 20 is in the "DC"

position. The uncoded modules illustrated in FIGS. 2 and 3 are used for electronic modules with 24 V direct voltage supply and can be inserted side-by-side in any combination into receptacles 11 to 18 (FIG. 1).

Figure 4:
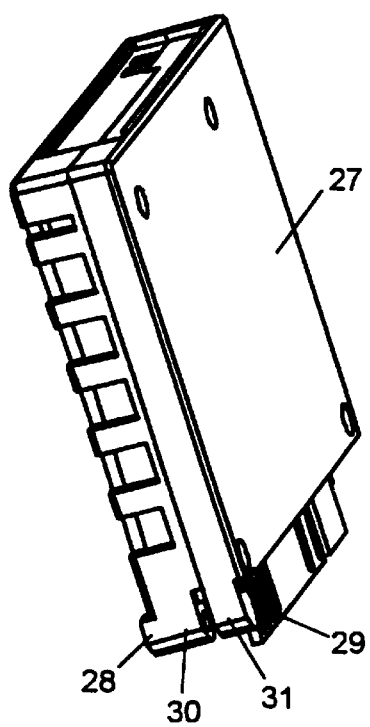
FIG. 4 shows a perspective view of a coded plug-in module.
Figure 5:
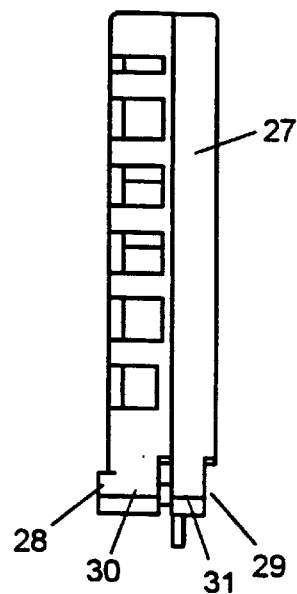
FIG. 5 shows a side view of the coded plug-in module illustrated in FIG. 4.

As illustrated in FIGS. 4 and 5, housing 27 of a coded module has a projection 28 for coding on one side and a recess 29 corresponding to the projection of an adjacent, coded plug-in module on the other side, so that coded modules can also be inserted side-by-side in any combination into receptacles 11 to 18. The coding is provided in the form of a variation in the width of pivot pins 30 and 31, thus preventing an uncoded module from being inserted into the swivel joint directly to the right of a coded module. This minimizes the forces acting on the coding pins, essentially avoiding damage to both the support unit and the plug-in modules during coding. In the immediate vicinity of a coded module, therefore, only another coded plug-in module can be inserted on the right side, while either an uncoded or a coded plug-in module can be inserted on the left. In a device for connecting external lines, the coding thus reliably ensures that the required minimum creepage distance for 230 V modules is not exceeded.

Although the embodiment of the present invention is described on the basis of a device in the form of a support unit for connecting external lines as well as conversion modules in the form of electronic modules for the receptacles in the support unit, the present invention is also suitable for any other type of support unit to code plug-in modules. For example, it can be used to code plug-in modules in a subrack or front connectors on a programmable controller equipped with input or output modules.

What is claimed is:

1. An arrangement for coded and uncoded plug-in modules, the plug-in modules being produced for insertion into a support unit with equidistant, adjacent receptacles, comprising:

coded plug-in modules, each having a projection on a first side, and having a recess on a second side, the recess corresponding to the projection of an adjacent coded plug-in module so that the coded plug-in modules can be inserted side-by-side in combinations into the receptacles of the support unit; and uncoded plug-in modules, none of the uncoded plug-in modules having the recess so that the uncoded modules cannot be inserted into a first receptacle of the receptacles, the first receptacle being directly adjacent to one of the coded plug-in modules on the second side of the one of the coded plug-in modules having the recess.

2. The arrangement according to claim 1, wherein each one of the coded plug-in modules further are pivotable about a pivot joint, the projection and the recess being located in an area of the pivot joint so that the projection can prevent a plug-in module from being inserted into the pivot joint.

3. A device for connecting external lines with equidistant, adjacent receptacles and with plug-in modules, the receptacles forming a receptacle array, the device comprising:

two signal channels corresponding to each of the receptacles, each of the two signal elements having connecting elements arranged side-by-side in half of the receptacle array in numerical order of the receptacles, a distance between the connecting elements corresponding to adjacent signal channels being greater than a required minimum creepage distance for currents in a case of a lower of possible operating voltages, and less than a required minimum creepage distance in a case of a higher of possible operating voltages, and a distance between the connecting elements of two channels, between which the connecting elements of another channel are located, being greater than the required minimum creepage distance for currents in the case of the higher operating voltage;

coded plug-in receptacles having the higher operating voltage, each one of the coded plug-in modules including a signal matching circuit for one signal channel having corresponding connecting elements on a first side of the one of the coded plug-in modules, each one of the coded plug-in modules further having a projection on a second side, and having a recess on a third side, the recess corresponding to a projection of an adjacent coded plug-in module, so that the coded plug-in modules can be inserted side-by-side in combinations into the receptacles; and uncoded plug-in modules having the lower operating voltage, each one of the uncoded plug-in modules having a signal matching circuit for two signal channels, none of the uncoded plug-in modules having the recess so that the uncoded modules cannot be inserted into a first receptacle of the receptacles, the first receptacle being directly adjacent to one of the coded plug-in modules on the third side of the one of the coded plug-in modules having the recess.

* * * * *